United States Patent
Izuoka et al.

(10) Patent No.: US 11,837,530 B2
(45) Date of Patent: Dec. 5, 2023

(54) LEAD FRAME WITH A SUPPORT PORTION HAVING A THROUGH HOLE OVER A HEAT DISSIPATION PLATE, SEMICONDUCTOR DEVICE, AND MANUFACTURING METHOD OF LEAD FRAME

(71) Applicant: SHINKO ELECTRIC INDUSTRIES CO., LTD., Nagano (JP)

(72) Inventors: Jun Izuoka, Nagano (JP); Koichi Ishida, Nagano (JP); Mitsuori Yoshimi, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 142 days.

(21) Appl. No.: 17/536,713

(22) Filed: Nov. 29, 2021

(65) Prior Publication Data

US 2022/0173019 A1 Jun. 2, 2022

(30) Foreign Application Priority Data

Dec. 2, 2020 (JP) .................................. 2020-200599
Sep. 1, 2021 (JP) .................................. 2021-142479

(51) Int. Cl.
*H01L 23/495* (2006.01)
*H01L 23/498* (2006.01)
*H01L 23/00* (2006.01)

(52) U.S. Cl.
CPC .... *H01L 23/49517* (2013.01); *H01L 23/4952* (2013.01); *H01L 23/49548* (2013.01); *H01L 23/49568* (2013.01); *H01L 23/49575* (2013.01); *H01L 23/49827* (2013.01); *H01L 24/45* (2013.01); *H01L 24/49* (2013.01); *H01L 2924/181* (2013.01)

(58) Field of Classification Search
CPC ........... H01L 2924/181; H01L 23/3107; H01L 23/49568; H01L 24/49; H01L 24/48; H01L 24/45; H01L 23/49517; H01L 23/49575; H01L 23/49827; H01L 23/49548; H01L 23/4952
See application file for complete search history.

(56) References Cited

U.S. PATENT DOCUMENTS 4,331,740 A * 5/1982 Burns ............... H01L 23/49541
361/813
5,293,301 A * 3/1994 Tanaka ............. H01L 23/49558
257/E23.092
5,541,447 A * 7/1996 Maejima .......... H01L 23/49541
361/813

(Continued)

FOREIGN PATENT DOCUMENTS

JP H08-162590 6/1996
JP H11-145364 5/1999

*Primary Examiner* — Alonzo Chambliss
(74) *Attorney, Agent, or Firm* — Rankin, Hill & Clark LLP

(57) ABSTRACT

A lead frame includes: a support portion having a through-hole formed in as end; a lead; and a heat dissipation plate welded with the support portion in one opening of the through-hole. A manufacturing method of a lead frame includes: shaping a frame member from a metal plate, the frame member including a support portion having a through-hole formed in an end, and a lead; and welding a heat dissipation plate with the support portion in one opening of the through hole.

24 Claims, 10 Drawing Sheets

(56) References Cited

U.S. PATENT DOCUMENTS

| | | | | |
|---|---|---|---|---|
| 5,691,567 A * | 11/1997 | Lo | ............................ | H01L 24/29 |
| | | | | 257/796 |
| 5,804,469 A * | 9/1998 | Asano | ............... | H01L 23/49541 |
| | | | | 257/E23.092 |
| 5,929,513 A * | 7/1999 | Asano | ................. | H01L 23/4334 |
| | | | | 257/796 |
| 5,969,413 A * | 10/1999 | Yano | ........................ | H01L 23/10 |
| | | | | 257/668 |
| 6,222,258 B1 * | 4/2001 | Asano | ............... | H01L 23/49541 |
| | | | | 257/676 |
| 6,239,487 B1 * | 5/2001 | Park | ......................... | H01L 24/32 |
| | | | | 257/793 |
| 2003/0183907 A1 * | 10/2003 | Hayashi | ............... | H01L 23/3121 |
| | | | | 257/E23.125 |
| 2005/0104168 A1 * | 5/2005 | Choi | ..................... | H01L 23/315 |
| | | | | 257/E23.128 |
| 2007/0210325 A1 * | 9/2007 | Park | ......................... | H01L 33/62 |
| | | | | 257/98 |
| 2008/0224162 A1 * | 9/2008 | Min | ......................... | H01L 33/62 |
| | | | | 257/E33.061 |
| 2015/0171026 A1 * | 6/2015 | Terai | ................... | H01L 29/1608 |
| | | | | 257/77 |
| 2023/0005827 A1 * | 1/2023 | Izuoka | .............. | H01L 23/49548 |

* cited by examiner

US 11,837,530 B2

LEAD FRAME WITH A SUPPORT PORTION HAVING A THROUGH HOLE OVER A HEAT DISSIPATION PLATE, SEMICONDUCTOR DEVICE, AND MANUFACTURING METHOD OF LEAD FRAME

CROSS-REFERENCE TO RELATED APPLICATIONS

This application is based upon and claims the benefit of priority of the prior Japanese Patent Application No. 2020-203, filed on Dec. 2, 2020 and Japanese Patent Application No. 2021-142479, filed on Sep. 1, 2021, the entire contents of which are incorporated herein by reference.

FIELD

The present invention relates to a lead frame, a semiconductor device, and a manufacturing method of the lead frame.

BACKGROUND

Recently, for example, a semiconductor device in which a semiconductor element such as an integrated circuit (IC) chip is mounted on a lead frame made of metal is known. More specifically, for example, a semiconductor element is mounted on a planar die pad provided at a center of a lead frame, and this semiconductor element is connected to plural leads, which are provided around the die pad, for example by wire bonding. In some cases, a semiconductor element mounted on a lead frame is encapsulated with a resin such as epoxy resin to form a semiconductor device.

Some of such lead frames are configured so that a heat dissipation plate joiner width a frame member having plural leads without providing a die pad. More specifically, in some cases, a heat dissipation plate which is thicker than the frame member joined, for example by welding, to a center of a frame member which is formed of a metal thin plate, and a semiconductor element is directly mounted on this heat dissipation plate. By virtue of this, the heat emitted by the semiconductor element can be efficiently dissipated by a simple structure.

Patent Literature 1: Japanese Laid-Open Patent Publication H11-145364
Patent Literature 2: Japanese Laid-Open Patent Publication H08-162590

However, when the heat dissipation plate is joined with the frame member, there is a problem that deformation or damage may be caused due to heat of the frame member or the heat dissipation plate. More specifically, in some cases, laser welding is used for joining fine parts such as joining of a frame member and a heat dissipation plate. When the frame member and the heat dissipation plate to be joined are subjected to radiation of laser for a long period of time, heat is transmitted to a circumference of the joined part, and thermal deformation or the like sometimes occurs. Particularly, when laser welding is carried out at a part where a frame member and a heat dissipation plate are overlapped, laser is radiated until the frame member formed of a thin plate is penetrated through to weld the frame member and the heat dissipation plate. Therefore, the joined part is irradiated with comparatively high-power laser, and a circumference of the joined part is also deformed or damaged in some cases.

On the other hand, if output of the laser is suppressed or the irradiation time of the laser is shortened in order to prevent such deformation or damage, welding of the frame member and the heat dissipation plate becomes insufficient, and quality of the lead frame and the semiconductor device is lowered.

SUMMARY

According to an aspect of an embodiment, a lead frame includes: a support portion having a through-hole formed in an end; a lead; and a heat dissipation plate welded with the support portion in one opening of the through-hole.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Hereinafter, an embodiment of a lead frame, a semiconductor device, and a manufacturing method of the lead frame disclosed by the present application will be described in detail with reference to drawings. Note that the present invention is not limited by this embodiment.

Figure 1A:
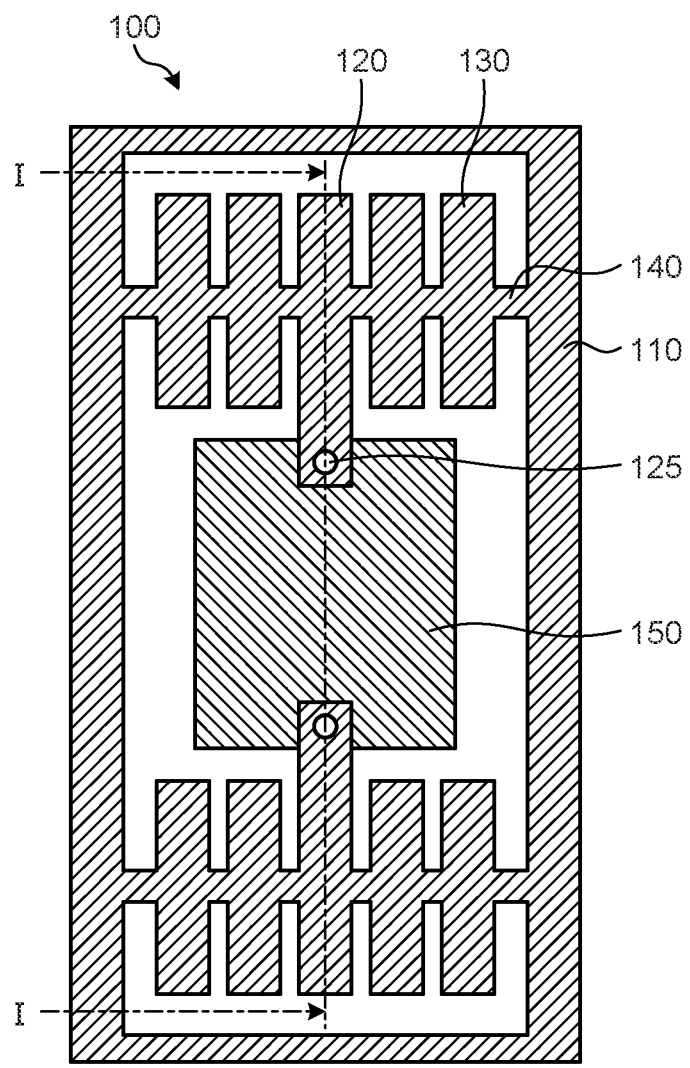
FIG. 1A and FIG. 1B are diagrams illustrating a structure of a lead frame according to an embodiment.
Figure 1B:
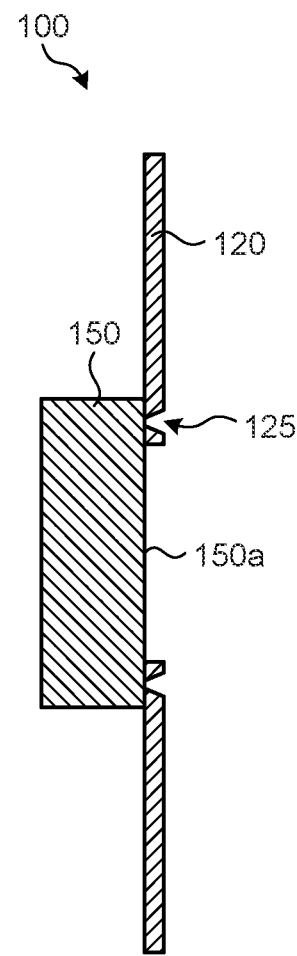

FIG. 1A and FIG. 1B are diagrams illustrating a structure of a lead frame 100 according to the embodiment. FIG. 1A is a plan view of the lead frame 100, and FIG. 1B is a cross-sectional view at a line I-I in FIG. 1A.

The lead frame 100 has a structure in which a heat dissipation plate 150 is joined to a frame member having a frame body 110, support bars 120, leads 130, and tie bars 140. The frame member is formed of, for example, a thin plate of metal such as copper or a copper alloy having a thickness of about 0.1 to 0.25 mm. On the other hand, the heat dissipation plate 150 is a plate-like member of metal such as copper or a copper alloy which has a plate thickness thicker than the thin plate forming the frame member and has, for example, a thickness of 1 mm or more.

The frame body 110 defines an outer periphery of the single lead frame 100 and supports the support bars 120 and the plural leads 130 via the tie bars 140. In manufacturing of the lead frame 100, plural lead frames 100 are manufactured as a gathering of lead frames connected via frame bodies 110. Then, after a semiconductor chip is mounted on the lead frame 100 and encapsulated with resin, the tie bar 140 between the plural leads 130 and between the leads 130 and the support bar 120 are cut. Then, since a part including the support bar 120, the plural leads 130, and the heat dissipation plate 150 is separated from the frame body 110, a diced semiconductor device is obtained.

The support bars 120 are a pair of support portions extending in a center of a short-side direction of the lead frame 100 from both ends of a long-side direction thereof toward the center, and the support bars 120 have end portions (hereinafter, referred to as "center-side end portions"), which are positioned at the center of the lead frame 100 and supporting the heat dissipation plate 150. More specifically, through-holes 125 are formed at respective positions of the center-side end portions of the pair of support bars 120 which are overlapped with the heat dissipation plate 150, and a mount surface 150a on which the semiconductor chip of the heat dissipation plate 150 is mounted is welded at the through-holes 125.

As illustrated in FIG. 1B, a cross section of the through-hole 125 has a taper shape having a diameter which is reduced as it gets closer to the heat dissipation plate 150. The diameter of the opening of the through-hole 125 which is distant from the heat dissipation plate 150 is, for example, about 0.4 mm, and the diameter of the opening which is close to the heat dissipation plate 150 of the through-hole 125 is, example, about 0.2 mm. Since the through-hole 125 has the taper shape in this manner, an inner wall surface of the through-hole 125 is exposed, for example, in the planar view illustrated in FIG. 1A.

The lead 130 is a terminal which extends in parallel with the support bar 120 and electrically connects a semiconductor chip to an external part when the semiconductor chip is mounted on the lead frame 100. The lead 130 is shorter than the support bar 120, and a center-side end portion of the lead 130 is not overlapped with the heat dissipation plate 150. In addition, a plating layer is formed on a surface of the center-side end portion of the lead 130 which is distant from the heat dissipation plate 150. When the semiconductor chip is mounted on the lead frame 100, the semiconductor chip is connected to the plating layer by wire bonding.

The heat dissipation plate 150 is a copper plate-like member joined with the center-side end portions of the pair of support bars 120. The surface of the heat dissipation plate 150 joined with the support bar 120 is the mount surface 150a on which the semiconductor chip is mounted. The mount surface 150a has undergone roughening treatment and has large surface roughness compared with other surfaces. The heat dissipation plate 150 dissipates heat, which is emitted from the semiconductor chip mounted on the mount surface 150a, from a surface in the opposite side of the mount surface 150a. Therefore, the surface in the opposite side of the mount surface 150a is exposed from a mold resin even in a state in which the semiconductor chip is encapsulated with the mold resin.

Figure 2:
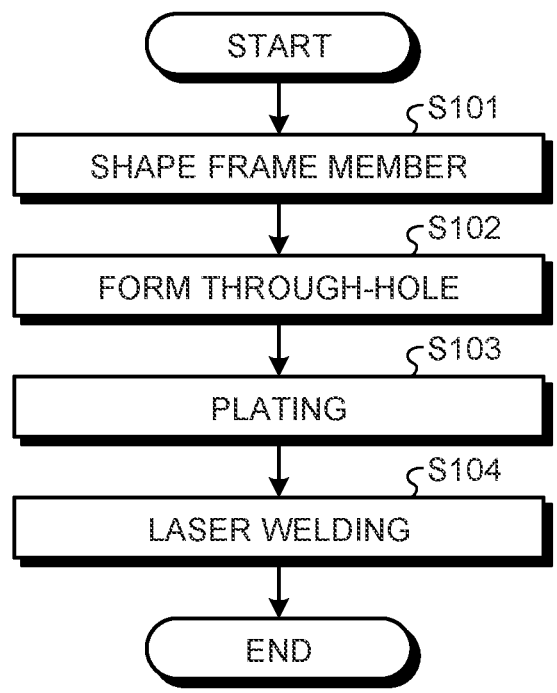
FIG. 2 is a flow diagram illustrating a manufacturing method of the lead frame.

Next, a manufacturing method of the lead frame 100 configured in the above described manner will be described with reference to a flow diagram illustrated in FIG. 2.

Figure 3:
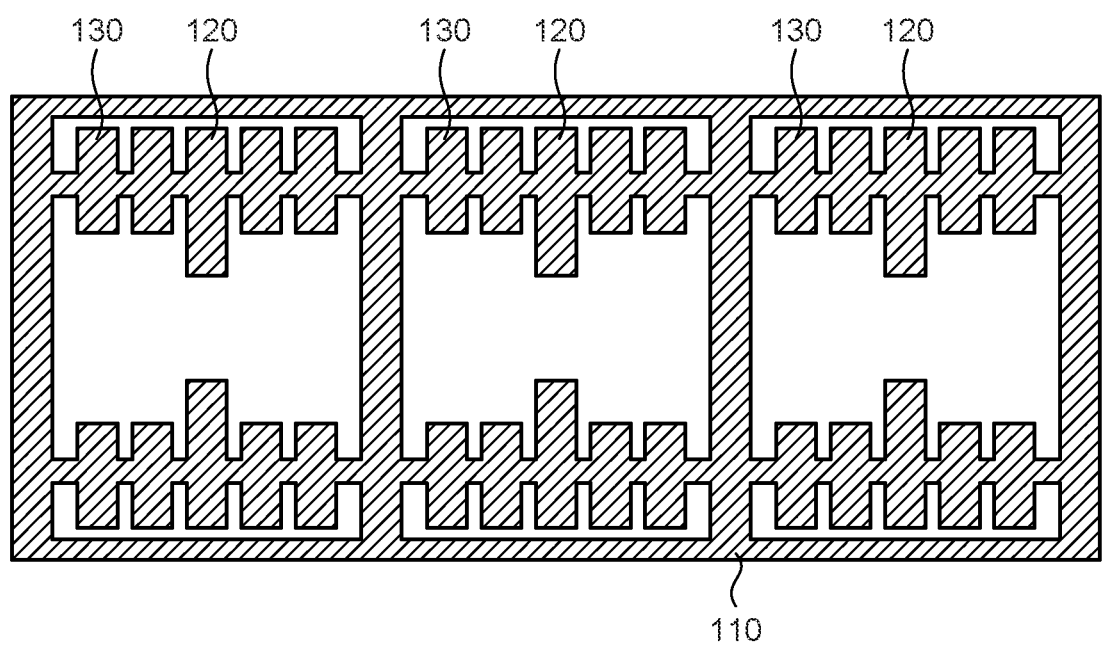
FIG. 3 is a diagram illustrating a specific example of a shaping process.

First, a frame member is shaped, for example, by pressing or etching of a thin plate of metal such as copper or a copper alloy having a thickness of about 0.1 to 0.25 mm (step S101). Specifically, for example as illustrated in FIG. 3, in each of the regions surrounded by the frame body 110, the support bar 120, the plural leads 130, and the tie bar 140 are formed.

Figure 4:
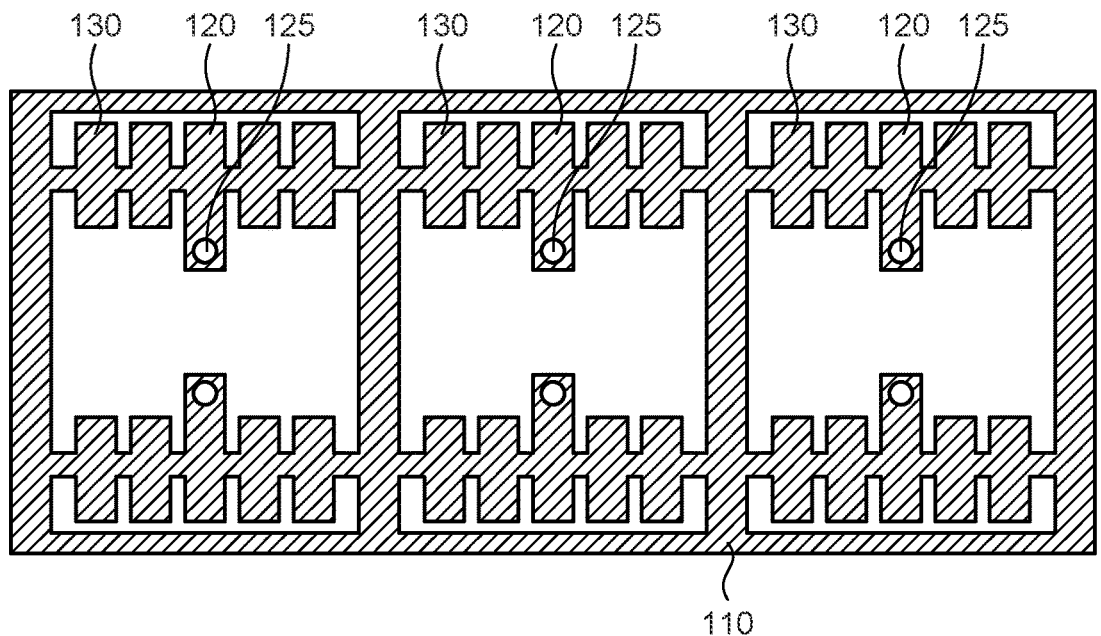
FIG. 4 is a diagram illustrating a specific example of a through-hole forming process.

Moreover, the through-hole 125 is formed in the center-side end portion of the support bar 120 (step S102). More specifically, for example as illustrated in FIG. 4, the through-holes 125 having the taper shape is formed in the center side end portions of the pair of support bars 120 in each region surrounded by the frame body 110. Note that the formation of the through-hole 125 in step S102 may be carried out at the same time as the shaping of the frame member in step S101. Also, the number and shape of the through-hole(s) 125 are not limited to one and the taper shape, respectively.

Figure 5A:
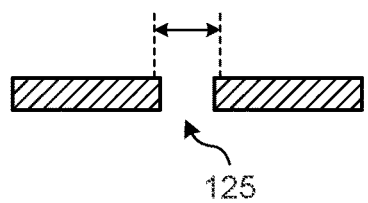
FIG. 5A, FIG. 5B, FIG. 5C, and FIG. 5D are diagrams illustrating specific examples or a shape of a through-hole.
Figure 5B:
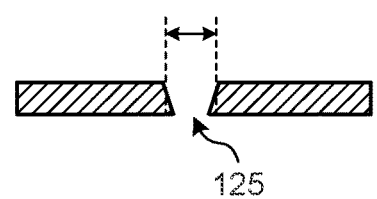

FIG. 5A, FIG. 5B, FIG. 5C, and FIG. 5D are diagrams illustrating specific examples of the shape of the through-hole 125. The through-hole 125 may be a through-hole having a cylindrical shape, for example, as illustrated in FIG. 5A or may be a through-hole having a conical trapezoidal shape having a taper shape as a cross section thereof, for example, as illustrated in FIG. 5B. These through-holes 125 are formed at the positions which are irradiated with laser when the heat dissipation plate 150 is joined with the support bars 120 by laser welding. In this process, a spot diameter of the laser radiated to the through-hole 125 illustrated in FIG. 5A is preferred to be larger than the diameter of the through-hole 125 so that a boundary of the support bar 120 and the heat dissipation plate 150 is irradiated with the laser. More specifically, as illustrated by a broken line in FIG. 5A, the irradiation area of the laser is preferred to include the entire opening of the through-hole 125. Also, the spot diameter of the laser radiated to the through-hole 125 illustrated in FIG. 5B is preferred to be larger than the diameter of the small-diameter opening of the through-hole 125 close to the heat dissipation plate 150. In other words, the irradiation area of the laser is preferred to include part of the inner wall surface of the through-hole 125 as illustrated by a broken line in FIG. 5B. In a case in which the through-hole 125 having a taper shape illustrated in FIG. 5B as a cross section thereof is formed, the inner wall surface of the through-hole 125 is exposed in a planar view. Therefore, the inner wall surface of the through-hole 125 is directly irradiated with the laser to increase the laser irradiation area with respect to the support bar 120, and welding can be efficiently carried out.

Figure 5C:
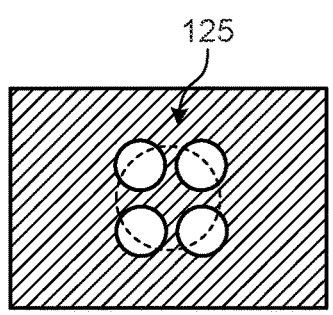
Figure 5D:
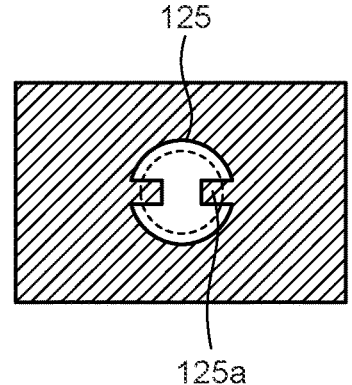

Also, the through-hole 125 may have plural through-holes, for example, as illustrated in FIG. 5C. In such a case, as illustrated by a broken line in FIG. 5C, the irradiation area of the laser is preferred to be an area across the plural through-holes. As a result of forming plural through-holes, even when the irradiation position of the laser has some errors, the boundary between the support bar 120 and the heat dissipation plate 150 is irradiated with the laser in any of the through-holes, and the heat dissipation plate 150 can be reliably welded with the support bar 120. Furthermore, the through-hole 125 may have a shape having tabs 125a projecting to the interior of the through-hole 125, for example, as illustrated in FIG. 5D. In such a case, as illustrated by a broken line in FIG. 5D, the irradiation area of the laser is preferred to be an area including at least part of the tabs 125a. Since the tab 125a projects to the interior of the through-hole 125, even if the spot diameter of the laser is smaller than the diameter of the through-hole 125, the boundary between the support bar 120 and the heat dissipation plate 150 is irradiated with the laser, and the heat dissipation plate 150 can be reliably welded with the support bar 120. The tab 125a may have a tilt toward the heat dissipation plate 150 by bending. By virtue of this, the distal end of the tab 125a is closely attached to the heat dissipation plate 150, and stable welding can be carried out.

Figure 6:
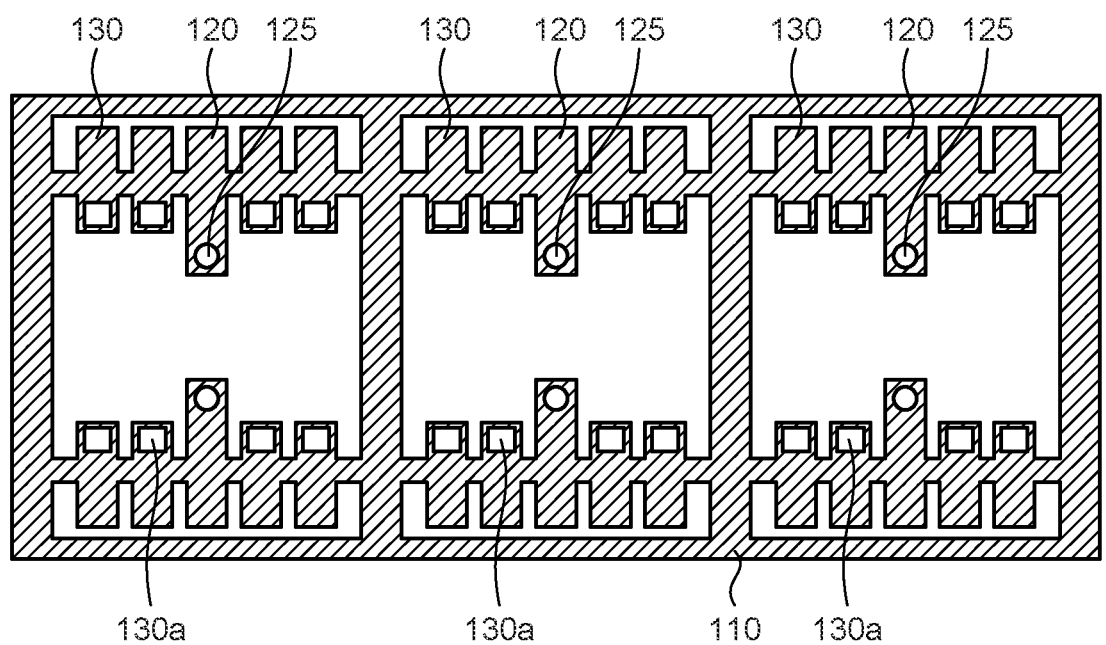
FIG. 6 is a diagram illustrating a specific example of a plating process.

After the through-hole 125 is formed in the support bar 120, the plating layer is formed on the center-side end portion of the lead 130 (step S103). Specifically, for example as illustrated in FIG. 6, a plating layer 130a is formed on a surface of the center-side end portion of each lead 130 which is in the opposite side of the surface joined with the heat dissipation plate 150. The plating layer 130a is formed, for example, by silver plating.

Figure 7:
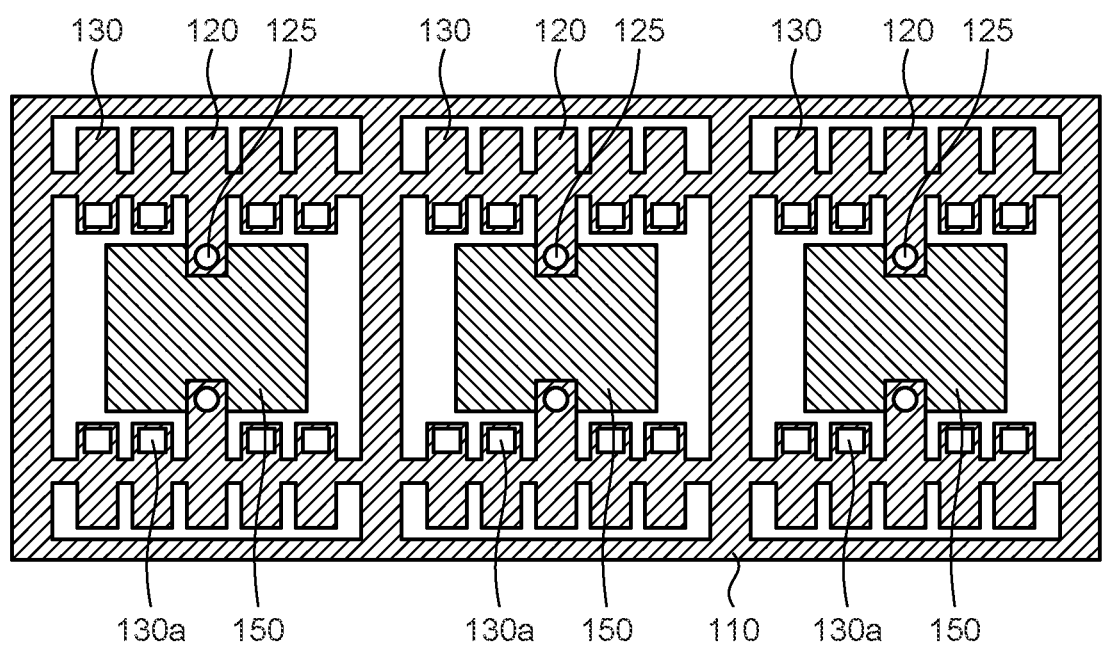
FIG. 7 is a diagram illustrating a specific example of a laser welding process.

By the above processes, the frame member using a copper thin plate as a material is completed. Therefore, the frame member is laser-welded with the heat dissipation plate 150 which, for example, has a thickness of 1 mm or more and is formed of metal such as copper or a copper alloy (step S104). More specifically, for example as illustrated in FIG. 7, the heat dissipation plate 150 is disposed so as to be overlapped with the through-holes 125 of the support bars 120, and the positions of the through-holes 125 are irradiated with laser. As a result, the heat dissipation plate 150 is welded with the support bars 120.

Figure 8A:
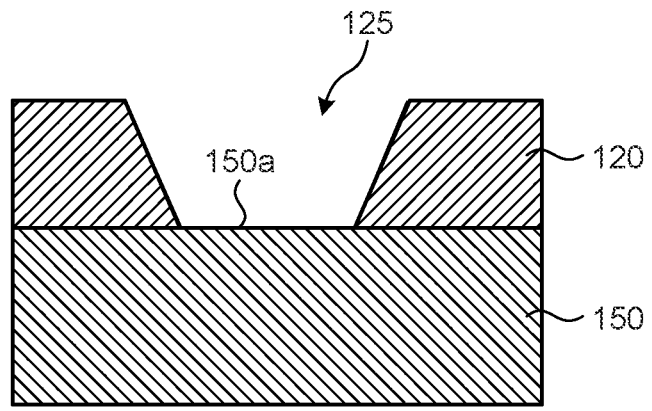
FIG. 8A, FIG. 8B, and FIG. 8C are diagrams describing the laser welding process.
Figure 8B:
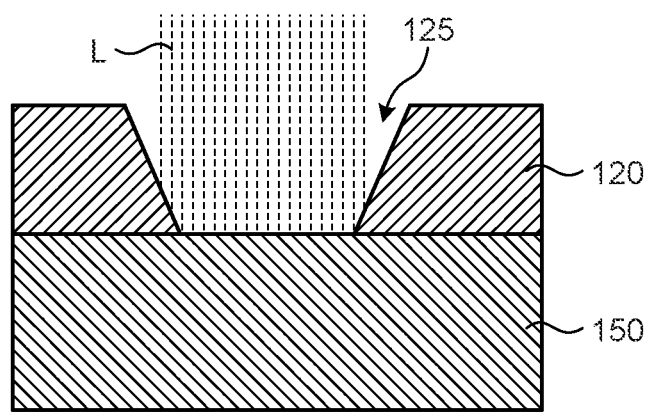

Specifically, as illustrated in FIG. 8A, alignment of the frame member and the heat dissipation plate 150 is carried out so that the through-holes 125 of the support bars 120 are overlapped with the welding positions of the mount surface 150a of the heat dissipation plate 150. Then, both of the vicinities of the through-holes 125 of the support bars 120 and the mount surface 150a of the heat dissipation plate 150 are irradiated with laser. More specifically, as illustrated in FIG. 8B, for example, an area including the inner wall surface of the through-hole 125 and the mount surface 150a of the heat dissipation plate 150 is irradiated with laser L. Herein, since the cross section of the through-hole 125 has a taper shape, the inner wall surface of the through-hole 125 is exposed when viewed from an irradiation source of the laser L. As a result, the inner wall surface of the through-hole 125 is directly irradiated with the laser L, and the laser irradiation area with respect to the support bar 120 can be it to efficiently carry out welding.

Figure 8C:
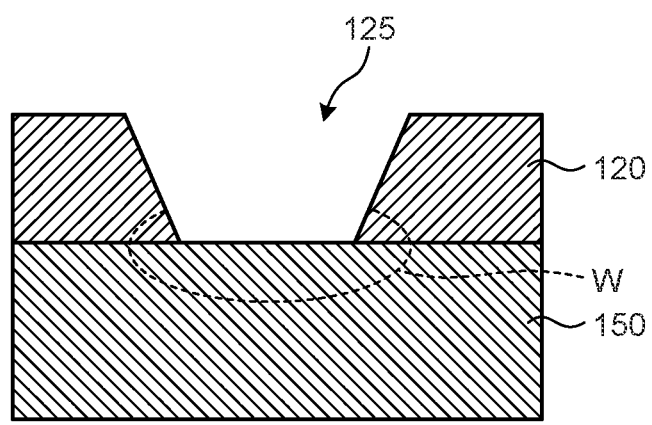

As a result of irradiating both of the vicinity of the through-hole 125 of the support bar 120 and the mount surface 150a of the heat dissipation plate 150 with laser in this manner, for example, an area W of the boundary between the support bar 120 and the heat dissipation plate 150 is welded, and the frame member and the heat dissipation plate 150 are integrated as illustrated in FIG. 8C.

The laser used in the laser welding may be, for example, green laser or fiber laser. Since the through-hole 125 is formed in the support bar 120 in advance, the output of the laser may be a comparatively low output such as an output of 1.5 kW or less. Also, the irradiation time of the laser at the position of each through-hole 125 may be, for example, about 0.2 to 0.5 second. In this manner, since the through-hole 125 is formed in the support bar 120 in advance, the output of the laser can be configured to be a low output, and the irradiation time thereof can also be configured to be a short period of time. As a result, the heat of the laser is not transmitted to the part excluding the vicinity of the through-hole 125 to be welded, and deformation and damage of the frame member and the heat dissipation plate 150 can be prevented.

Figure 9:
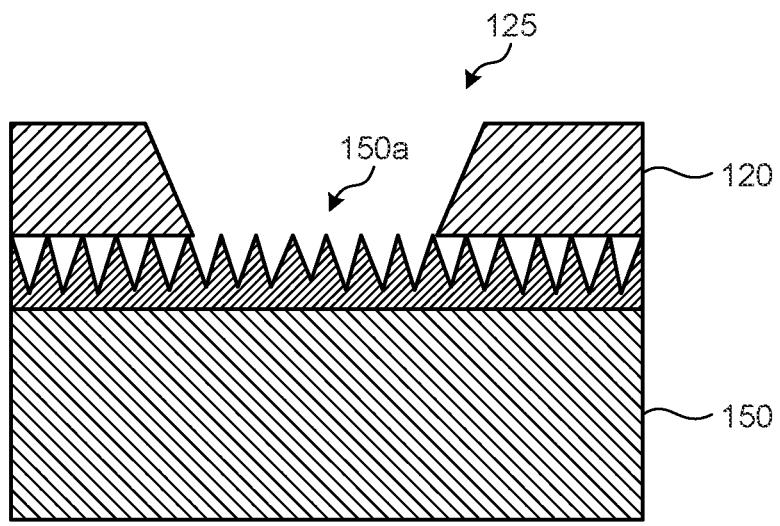
FIG. 9 is a diagram illustrating a specific example of a semiconductor-chip mount surface of a heat dissipation plate.

Also, the mount surface 150a to be welded with the support bars 120 of the heat dissipation plate 150 has undergone roughening treatment and become a roughened surface. Specifically, for example, as illustrated in FIG. 9, the surface roughness of the mount surface 150a of the heat dissipation plate 150 has been increased by roughening plating or anodization of copper. In other words, the surface roughness of the mount surface 150a of the heat dissipation plate 150 is larger than the surface roughness of the surface which is in the opposite side of the mount surface 150a of the heat dissipation plate 150. Therefore, the surface roughness of the mount surface 150a exposed from the bottom surface of the through-hole 125 of the support bar 120 is large, reflection of the laser which passes through the through-hole 125 and radiated to the mount surface 150a can be suppressed, the absorption properties of the laser is improved, and efficient welding can be carried out.

In this manner, the lead frame 100 is formed by laser-welding the heat dissipation plate 150 at the through-holes 125 of the support bars 120. A semiconductor chip is mounted on this lead frame 100, and the semiconductor chip is encapsulated, for example, with a mold resin such as an epoxy resin. Then, a semiconductor device is obtained by cutting the support bars 120 and the leads 130 from the frame body 110.

Figure 10A:
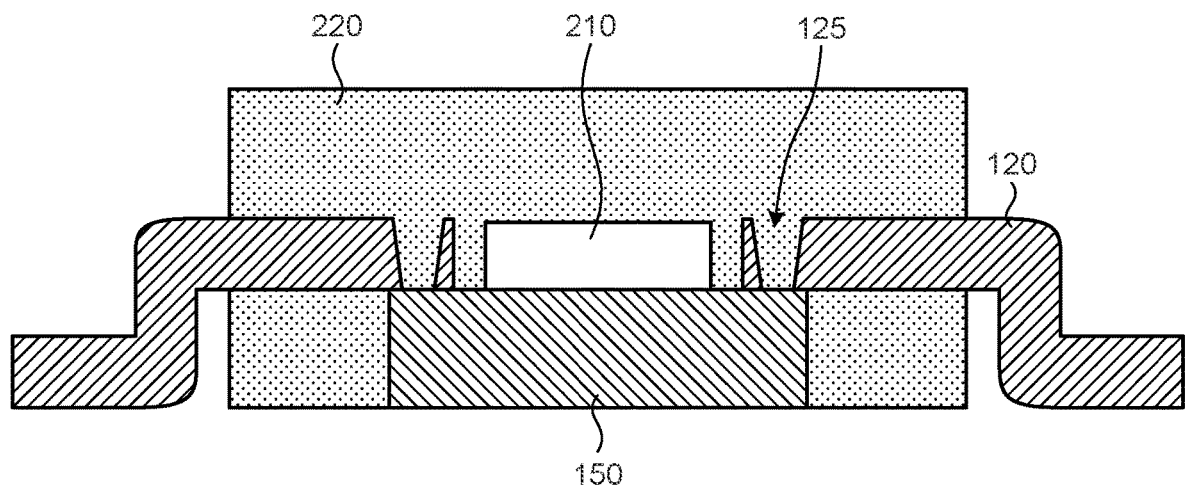
FIG. 10A and FIG. 10B are diagrams illustrating a specific example of a structure of a semiconductor device.
Figure 10B:
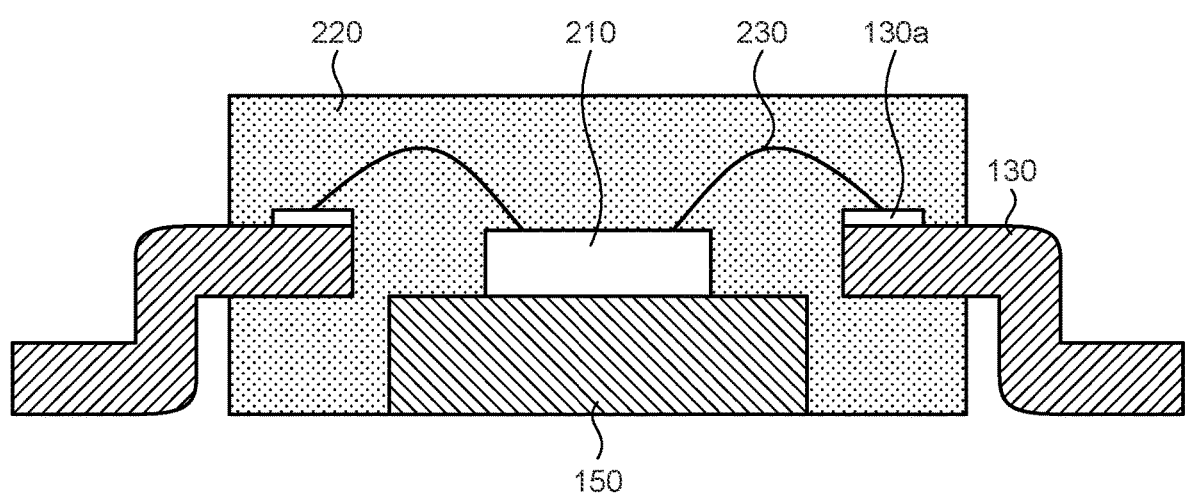

FIG. 10A and FIG. 10B are diagrams illustrating a specific example of the structure of the semiconductor device. FIG. 10A illustrates a cross section of the semiconductor device at a position along the support bar 120, and FIG. 10B illustrates a cross section of the semiconductor device at a position along the lead 130.

As illustrated in FIG. 10A and FIG. 10B, a semiconductor chip 210 is mounted on the mount surface 150a of the heat dissipation plate 150, and the semiconductor chip 210 and the leads 130 are connected to each other by bonding. In other words, electrodes of the semiconductor chip 210 and the plating layers 130a of the leads 130 are connected to each other by wires 230. Then, the semiconductor chip 210 is encapsulated with a mold resin 220. Herein, the surface of the heat dissipation plate 150 which is in the opposite side of the mount surface 150a is exposed from the mold resin 220, and the heat emitted from the semiconductor chip 210 mounted on the mount surface 150a can be efficiently dissipated.

The center-side end portion of the support bar 120 in which the through-hole 125 is formed is encapsulated with the mold resin 220 together with the semiconductor chip 210, and the other end portion of the support bar 120 is projecting from a lateral surface of the mold resin 220 and is bent in a shape similar to the lead 130. The support bar 120 bent in the shape similar to the lead 130 in this manner may be used as a lead for ground wiring. On the other hand, e center-side end portion of the lead 130 connected to the semiconductor chip 210 by the plating layer 130a is encapsulated with the mold resin 220 together with the semiconductor chip 210, and the other end portion of the lead 130 is projecting from the lateral surface of the mold resin 220 and is bent. The end portion of the lead 130 projecting from the mold resin 220 can be connected to another part such as a wiring substrate. More specifically, the lead 130 is used, for example, as a lead for signal wiring.

As described above, according to the present embodiment, the through-holes are formed in advance in the frame member, which is formed of a thin plate, and the heat dissipation plate having a larger thickness than the frame member is joined by laser welding at the through-holes. Therefore, the output of the laser for welding can be configured to be a low output, and the irradiation time of the laser can be configured to be a short period of time. As a result, the heat of the laser is not transmitted to the part excluding the vicinity of the through-hole, and unnecessary deformation and damage caused by welding can be prevented.

Note that, in the above described embodiment, the lead frame 100 used in the semiconductor device of a Small Outline Package (SOP) type, in which the leads 130 project in two directions from the mold resin 220, has been described. However, the lead frame 100 similar to that of the above described embodiment can be also applied to a semiconductor device of a Quad Flat Package (QFP) type, in which the leads 130 project in four directions from the mold resin 220.

Also, the lead frame 100 similar to that of the above described embodiment can be also applied to a semiconductor device of, example, a Small Outline Non-leaded package (SON) type or a Quad Flat Non-leaded package (QFN) type, in which the leads 130 do not project from the mold resin 220.

Figure 11A:
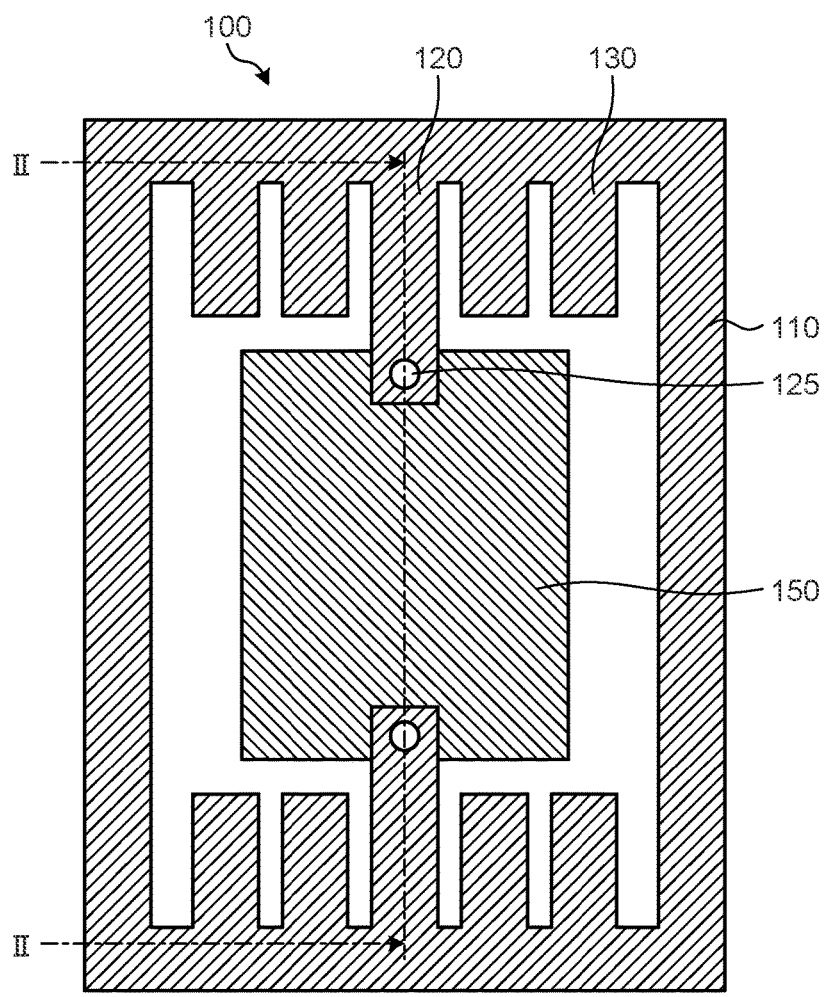
FIG. 11A and FIG. 11B are diagrams illustrating a structure of a lead frame according to another embodiment.
Figure 11B:
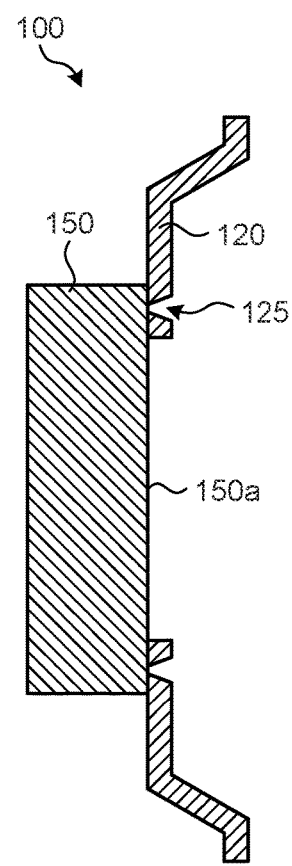

FIG. 11A and FIG. 11B are diagrams illustrating structure of the lead frame 100 used in a semiconductor device of the SON type. FIG. 11A is a plan view of the lead frame 100, and FIG. 11B is a cross-sectional view at a line II-II of FIG. 11A.

In the lead frame 100 illustrated in FIG. 11A and FIG. 11B, each of the support bars 120 and the leads 130 is extending from the short side of the frame body 110 in the long-side direction of the lead frame 100. In the center-side end portion of the support bar 120, as well as the above described embodiment, the through-hole 125 having the taper shape in the cross section thereof is formed, and the heat dissipation plate 150 is welded by the rough-hole 125. The heat dissipation plate 150 is welded with the support bar 120 by the mount surface 150a on which the semiconductor chip is mounted. Also, the support bar 120 and the lead 130 are bent, and the end portions thereof in the opposite side of the center-side end portions are at the positions of external terminals of the semiconductor device.

Also in the lead frame 100 like this, since the through-hole 125 is formed in advance in the center-side end portion of the support bar 120, when the heat dissipation plate 150 is to be laser-welded with the support bar 120, the output of the laser can be configured to be a low output, and the irradiation time of the laser can be configured to be a short period of time. As a result, the heat of the laser is not transmitted to the part excluding the vicinity of the through-hole, and unnecessary deformation and damage caused by welding can be prevented.

Figure 12A:
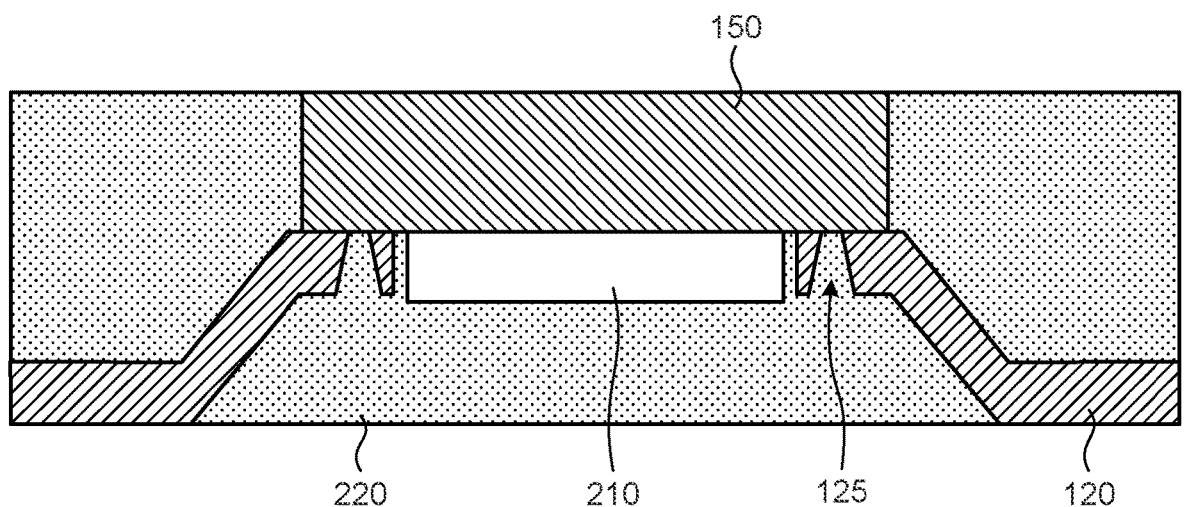
FIG. 12A and FIG. 12B are diagrams illustrating another specific example of the structure of the semiconductor device.
Figure 12B:
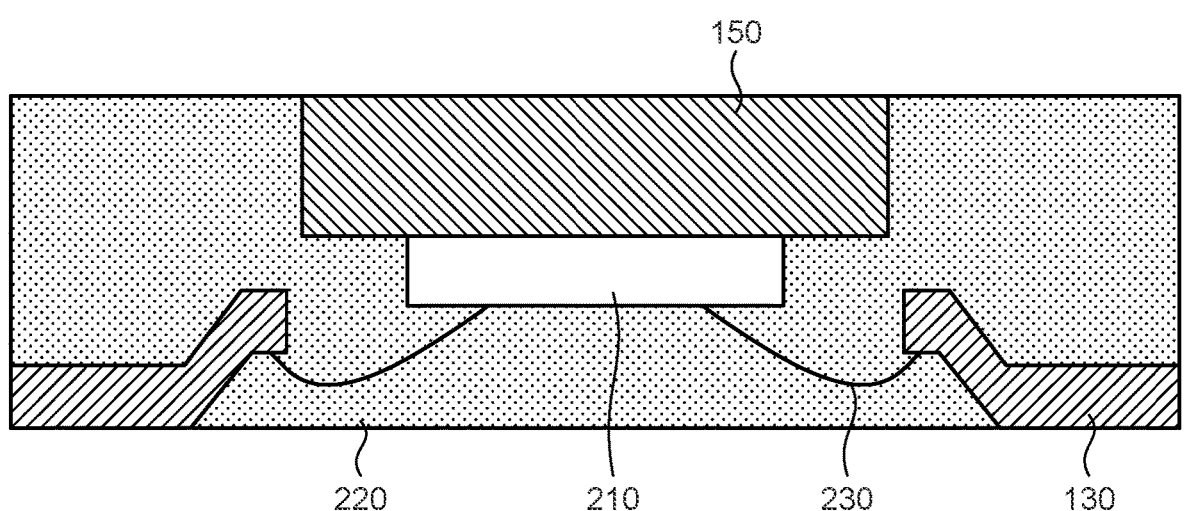

FIG. 12A and FIG. 12B are diagrams illustrating a specific example of a structure of a semiconductor device. FIG. 12A illustrates a cross section of the semiconductor device at a position along the support bar 120, and FIG. 12B illustrates a cross section of the semiconductor device at a position along the lead 130.

As illustrated in FIG. 12A and FIG. 12B, the semiconductor chip 210 is mounted on the mount surface 150a of the heat dissipation plate 150, and the semiconductor chip 210 and the leads 130 are connected to each other by wire bonding. In other words, the electrodes of the semiconductor chip 210 and the leads 130 are connected to each other by the wires 230. Then, the entire lead frame 100 on which the semiconductor chip 210 is mounted is encapsulated with the mold resin 220. Herein, the surface of the heat dissipation plate 150 which is in the opposite side of the mount surface 150a is exposed from the mold resin 220, and the heat emitted from the semiconductor chip 210 mounted on the mount surface 150a can be efficiently dissipated.

Also, the end portions in the opposite side of the center-side end portions of the support bar 120 and the lead 130 are exposed from the lateral surface and a lower surface of the mold resin 220. Since the end portion of the lead 130 is exposed from the mold resin 220, this end portion serves as an external terminal which connects the semiconductor device to another part such as a wiring substrate.

In this manner, the semiconductor device of the SON type or the QFN type, in which the lead 130 does not project from the mold resin 220, can be also formed by using the above described lead frame 100.

In the above described embodiment, the description has been given on the assumption that the entire opening of the through-hole 125 of the support bar 120 is included in the irradiation area of the laser. As such laser, for example, green laser (wavelength: 532 nm) having a spot diameter of about 0.2 to 0.3 mm can be used. On the other hand, for example, when the laser welding is carried out using fiber laser (wavelength: 1064 nm) having a spot diameter of about 0.024 to 0.044 mm, which is smaller than that of the green laser, plural locations of the opening of the through-hole 125 may be configured to be irradiated with the laser.

Figure 13A:
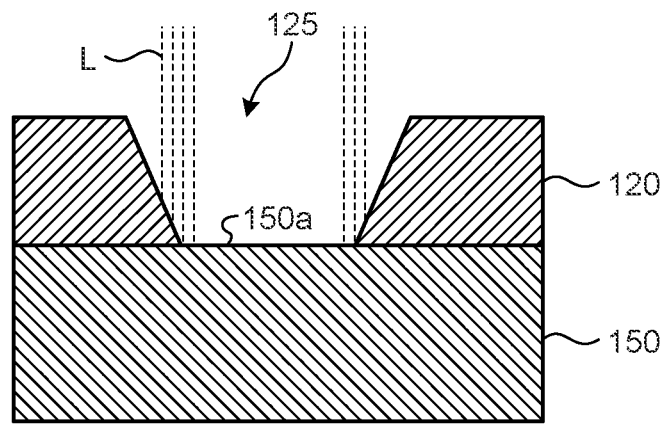
FIG. 13A, FIG. 13B, and FIG. 13C are diagrams describing another laser welding process.

Specifically, for example, as illustrated in FIG. 13A, for example, plural locations in the vicinity of the boundary between the inner wall surface of the through-hole 125 and the mount surface 150a of the heat dissipation plate 150 are irradiated with the laser L. The output of the laser L radiated to each of the plural locations requires a comparatively low output, and, for example, an output of 1.5 kW or less can be used. Also, the irradiation time of the laser at each of the plural locations can be, for example, about 0.2 to 0.5 seconds. In this manner, since the through-hole 125 is formed in the support bar 120 in advance, even in the case in which the laser welding is carried out by using fiber laser having a comparatively small spot diameter, the output of the laser can be configured to be a low output, and the irradiation time thereof can also be configured to be a short period of time. As a result, the heat of the laser is not transmitted the part excluding the vicinity of the through-hole 125 to be welded, and deformation and damage of the frame member and the heat dissipation plate 150 can be prevented.

Figure 13B:
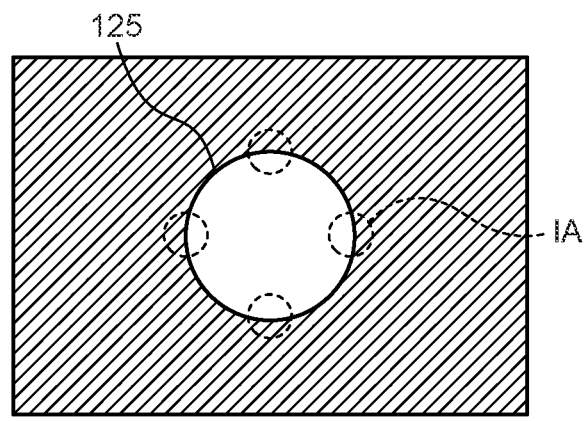

Also, for example in a case in which the through-hole 125 has a cylindrical shape as illustrated in FIG. 13B, plural locations of an opening edge of the through-hole 125 serve as irradiation areas IA of the laser, and the support bar 120 and the heat dissipation plate 150 are joined at the plural locations. In the example illustrated in FIG. 13B, four locations of the opening edge of the through-hole 125 serve as the irradiation area IA of the laser. However, at least two locations thereof can be used as the irradiation areas IA of the laser. The support bar 120 and the heat dissipation plate 150 are joined in the vicinities of the plural laser irradiation areas IA. Therefore, the more the irradiation areas IA of the laser, the higher the reliability of the joining between the support bar 120 and the heat dissipation plate 150.

Figure 13C:
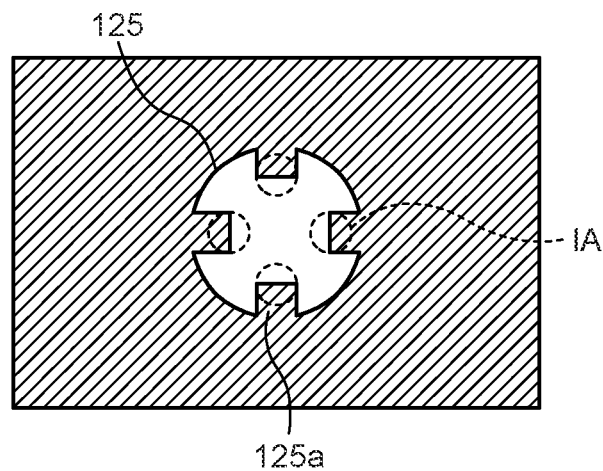

Furthermore, for example also in a case in which the plural tabs 125a projecting to the interior of the through-hole 125 are formed as illustrated in FIG. 13C, for example, the vicinities of the distal ends of the plural tabs 125a can be used as the irradiation areas IA of the laser, respectively. In such a case, the irradiation areas IA of the laser can be provided not only in the vicinities of the distal ends of the tab 125a, but also in vicinities of the roots of the tabs 125a and at the opening edge of the through-hole 125. Also, for example, when the tabs 125a are formed to be thinner than the main body of the support bar 120 therearound, the output of the laser can be further lowered, and the irradiation time can be further shortened.

With respect to the embodiments and the variety thereof described above, the following notes are further disclosed.

(Note 1) A manufacturing method of a lead frame, the method comprising:
shaping a frame member from a metal plate, the frame member including a support portion having a through-hole formed in an end, and a lead; and
welding a heat dissipation plate with the support portion in one opening of the through hole.

(Note 2) The manufacturing method of a lead frame according to Note 1, wherein
the shaping includes
shaping the frame member including the support portion having the through-hole having a taper shape in which another opening has a diameter larger than a diameter of the one opening.

(Note 3) The manufacturing method of a lead frame according to Note 1, wherein
the shaping includes
forming a plurality of through-holes in the end of the support portion.

(Note 4) The manufacturing method of a lead frame according to Note 1, wherein
the shaping includes
forming the through-hole having a tab projecting inward.

(Note 5) The manufacturing method of a lead frame according to Note 1, the method further comprising carrying out roughening treatment for causing a surface roughness of a first surface of the heat dissipation plate to be larger than a surface roughness of another surface wherein,
the welding includes
welding the first surface of the heat dissipation plate with the support portion.

(Note 6) The manufacturing method of a lead frame according to Note 1, wherein,
the welding includes
carrying out laser welding by using laser having a spot diameter larger than a diameter of the through-hole.

(Note 7) The manufacturing method of a lead frame according to Note 1, wherein,
the welding includes
carrying out laser welding by using laser having a spot diameter smaller than a diameter of the through-hole.

(Note 8) The manufacturing method of a lead frame according to Note 1, wherein,
the welding includes
welding the heat dissipation relate with the support portion at a plurality of locations of the one opening of the through-hole.

According to one aspect of a lead frame, a semiconductor device, and a manufacturing method of the lead frame disclosed by the present application, an effect of preventing unnecessary deformation and damage caused by welding is exerted.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A lead frame comprising:
a plurality of support portions, each of the plurality of support portions having a through-hole formed in an end;
a lead; and
a heat dissipation plate welded with the plurality of support portions in one opening of the through-hole of each of the plurality of support portions,
wherein an inner circumference of the one opening of the through-hole of each of the plurality of support portions is welded with the heat dissipation plate.

2. The lead frame according to claim 1, wherein
the through-hole of each of the plurality of support portions has a taper shape in which another opening has a diameter larger than a diameter of the one opening.

3. The lead frame according to claim 1, wherein
the through-hole of each of the plurality of support portions has a tab projecting inward.

4. The lead frame according to claim 1, wherein
the heat dissipation plate has a surface joined with the plurality of support portions, the surface having a surface roughness larger than a surface roughness of another surface.

5. The lead frame according to claim 1, wherein
the heat dissipation plate is welded with the plurality of support portions at a plurality of locations of the one opening of the through-hole of each of the plurality of support portions.

6. A semiconductor device comprising:
a lead frame;
a semiconductor element mounted on the lead frame; and
an encapsulating resin encapsulating the semiconductor element,
wherein
the lead frame includes
a plurality of support portions, each of the plurality of support portions having a through-hole formed in an end,
a lead, and
a heat dissipation plate welded with the plurality of support portions in one opening of the through-hole of each of the plurality of support portions,
an inner circumference of the one opening of the through-hole of each of the plurality of support portions is welded with the heat dissipation plate, and
the semiconductor element is mounted on a first surface of the heat dissipation plate and is connected to the lead.

7. The semiconductor device according to claim 6, wherein
the through-hole of each of the plurality of support portions has a taper shape in which another opening has a diameter larger than a diameter of the one opening.

8. The semiconductor device according to claim 6, wherein
the through-hole of each of the plurality of support portions has a tab projecting inward.

9. The semiconductor device according to claim 6, wherein the heat dissipation plate has a surface joined with the plurality of support portions, the surface having a surface roughness larger than a surface roughness of another surface.

10. The semiconductor device according to claim 6, wherein
the heat dissipation plate is welded with the plurality of support portions at a plurality of locations of the one opening of the through-hole of each of the plurality of support portions.

11. The semiconductor device according to claim 6, wherein
the heat dissipation plate has a second surface in an opposite side of the first surface, the second surface being exposed from the encapsulating resin.

12. The semiconductor device according to claim 6, wherein
the lead is partially exposed from the encapsulating resin.

13. A lead frame comprising:
a support portion having a through-hole formed in an end;
a lead; and
a heat dissipation plate welded with the support portion in one opening of the through-hole,
wherein the heat dissipation plate has a surface joined with the support portion, the surface having a surface roughness larger than a surface roughness of another surface.

14. The lead frame according to claim 13, wherein
the through-hole has a taper shape in which another opening has a diameter larger than a diameter of the one opening.

15. The lead frame according to claim 13, wherein
a plurality of through-holes are formed in the end of the support portion.

16. The lead frame according to claim 13, wherein
the through-hole has a tab projecting inward.

17. The lead frame according to claim 13, wherein
the heat dissipation plate is welded with the support portion at a plurality of locations of the one opening of the through-hole.

18. A semiconductor device comprising:
a lead frame;
a semiconductor element mounted on the lead frame; and
a encapsulating resin encapsulating the semiconductor element,
wherein
the lead frame includes
a support portion having a through-hole formed in an end,
a lead, and
a heat dissipation plate welded with the support portion in one opening of the through-hole,
the semiconductor element is mounted on a first surface of the heat dissipation plate and is connected to the lead, and
the heat dissipation plate has a surface joined with the support portion, the surface having a surface roughness larger than a surface roughness of another surface.

19. The semiconductor device according to claim 18, wherein
the through-hole has a taper shape in which another opening has a diameter larger than a diameter of the one opening.

20. The semiconductor device according to claim 18, wherein
a plurality of through-holes are formed in the end of the support portion.

21. The semiconductor device according to claim 18, wherein
the through-hole has a tab projecting inward.

22. The semiconductor device according to claim 18, wherein
the heat dissipation plate is welded with the support portion at a plurality of locations of the one opening of the through-hole.

23. The semiconductor device according to claim 18, wherein
the heat dissipation plate has a second surface in an opposite side of the first surface, the second surface being exposed from the encapsulating resin.

24. The semiconductor device according to claim 18, wherein
the lead is partially exposed from the encapsulating resin.

* * * * *